US007000211B2

(12) United States Patent
Arnold (10) Patent No.: US 7,000,211 B2
(45) Date of Patent: *Feb. 14, 2006

(54) SYSTEM AND METHOD FOR EFFICIENTLY MAPPING HETEROGENEOUS OBJECTS ONTO AN ARRAY OF HETEROGENEOUS PROGRAMMABLE LOGIC RESOURCES

(75) Inventor: Jeffrey M. Arnold, San Diego, CA (US)

(73) Assignee: Stretch, Inc., Moutain View, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 376 days.

(21) Appl. No.: 10/404,680

(22) Filed: Mar. 31, 2003

(65) Prior Publication Data

US 2004/0194048 A1    Sep. 30, 2004

(51) Int. Cl.
G06F 17/50    (2006.01)
(52) U.S. Cl. .............................. 716/17; 716/9; 716/10; 716/16
(58) Field of Classification Search ................ 716/2–3, 716/7–13, 16–18
See application file for complete search history.

(56) References Cited

U.S. PATENT DOCUMENTS

| 5,258,668 A | 11/1993 | Cliff et al. |
| 5,260,610 A | 11/1993 | Pedersen et al. |
| 5,260,611 A | 11/1993 | Cliff et al. |
| 5,274,581 A | 12/1993 | Cliff et al. |
| 5,343,406 A | 8/1994 | Freeman et al. |
| 5,357,152 A | 10/1994 | Jennings, III |
| 5,414,377 A | 5/1995 | Freidin |
| 5,426,378 A | 6/1995 | Ong |
| 5,436,574 A | 7/1995 | Veenstra |
| 5,726,584 A | 3/1998 | Freidin |
| 5,742,180 A | 4/1998 | DeHon et al. |
| 5,920,202 A | 7/1999 | Young et al. |
| 5,926,036 A | 7/1999 | Cliff et al. |
| 5,963,050 A | 10/1999 | Young et al. |
| 5,977,793 A | 11/1999 | Reddy et al. |
| 5,982,195 A | 11/1999 | Cliff et al. |
| 5,986,465 A | 11/1999 | Mendel |
| 6,298,472 B1 * | 10/2001 | Phillips et al. ................. 716/18 |
| 6,633,181 B1 | 10/2003 | Rupp |
| 2001/0001881 A1 * | 5/2001 | Mohan et al. ................. 716/1 |
| 2001/0049816 A1 | 12/2001 | Rupp |

\* cited by examiner

Primary Examiner—Paul Dinh (74) Attorney, Agent, or Firm—Carr & Ferrell LLP (57) ABSTRACT

A system and method of mapping heterogeneous objects onto an array of heterogeneous programmable logic resources. The method comprises clustering to identify datapath modules from a netlist. The method further comprises aggregating the datapath modules into higher level modules. The method also comprises clustering random logic into structures.

28 Claims, 5 Drawing Sheets

SYSTEM AND METHOD FOR EFFICIENTLY MAPPING HETEROGENEOUS OBJECTS ONTO AN ARRAY OF HETEROGENEOUS PROGRAMMABLE LOGIC RESOURCES

RELATED APPLICATION

This patent application is related to the following, each of which are incorporated herein in their entirety for all purposes:

U.S. patent publication No. US 2001/0049816 to Adaptive Silicon, Inc., entitled "Multi-Scale Programmable Array" (hereinafter the "Programmable Logic Device Application");

U.S. Patent Application entitled "Transitive Processing Unit for Performing Complex Operations," filed Mar. 21, 2003 (hereinafter the "TPU Application"); and U.S. Patent Application entitled "Extension Adapter," attorney docket number STRETC 2561, filed concurrently herewith, (hereinafter the "Extension Adapter Application").

BACKGROUND OF THE INVENTION

1. Field of the Invention

The present invention relates generally to processor systems, and more particularly to programmable logic technology mapping and placement.

2. Background of the Invention

Digital signal processing (DSP), encryption and other complex functions require high levels of computational power to perform the underlying intricate arithmetic operations. To improve the functionality and performance of processing such complex functions, programmable embedded systems have been implemented in electronic devices designed for specific applications. Some of these programmable embedded systems include Field Programmable Gate Array (FPGA) technology to provide programmable functions. FGPAs generally include a basic standard-cell logic disposed in a programmable array structure. FPGAs, however, are designed to be universally used in a multitude of applications and thus comprise many logic gates, such as from 400,000 to 1.5 million (or more) gates, for adaptation to a specific application. But in most applications, the large amounts of programmable logic of the FPGAs go unused and effectively become wasted.

A unique approach to providing for programmable embedded systems that minimizes unused programmable functionalities, among other things, uses one or more configurable arithmetic logic units (CALUs) disposed in rows and columns of a programmable logic array. Because CALUs provide scalable (i.e., configurable) functionality in terms of circuitry and routing resources, the programmable logic arrays having CALUs are referred to as a multi-scale programmable logic arrays (MSAs). The programmable logic core of an MSA is a programmable logic fabric that can be customized to implement any digital circuit after fabrication of, for example, a System on a Programmable Chip (SOPC). The programmable logic fabric comprises any number of uncommitted gates and programmable interconnects between these gates so that they can be later programmed to perform specific functions. An MSA architecture allows digital logic to be designed and programmed using both small-scale block (e.g., gate level blocks) and/or medium scale block (e.g., Register Transfer Level, or "RTL," blocks) techniques.

In an MSA architecture optimized for simple arithmetic operations, such as binary addition, subtraction, Boolean logic functions, etc., the CALUs can provide results expeditiously.

When designing a programmable logic device (PLD), a strategy is desired for placing objects derived from a high level language onto the PLD architecture. Many prior art attempts do not place those objects into PLDs efficiently and quickly. These prior art attempts often involve software that, due to the algorithms, takes an inordinate amount of time to run.

Thus, an improved system and method for programmable logic technology mapping and placement is desired.

SUMMARY OF THE INVENTION

The present invention provides, in various embodiments, a system and method for mapping heterogeneous objects onto an array of heterogeneous programmable logic resources. In one embodiment, a method comprises clustering to identify datapath modules from a netlist. The method further comprises aggregating the datapath modules into higher level modules. The method also comprises clustering random logic into structures.

In another embodiment, a system is provided for mapping heterogeneous objects onto an array of heterogeneous programmable logic resources. The system comprises a first clustering module for clustering to identify datapath modules from a netlist. The system further comprises an aggregating module for aggregating the datapath modules into higher level modules. The system also comprises a second clustering module for clustering random logic into structures.

A further understanding of the nature and advantages of the inventions herein may be realized by reference to the remaining portions of the specification and the attached drawings.

DESCRIPTION OF THE SPECIFIC EMBODIMENTS

As shown in the exemplary drawings wherein like reference numerals indicate like or corresponding elements among the figures, embodiments of a system and method according to the present invention will now be described in detail. The following description sets forth an example of a system and method for efficiently mapping heterogeneous objects onto an array of heterogeneous programmable logic resources.

Detailed descriptions of various embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure, method, process or manner.

As previously mentioned, programmable logic technology mapping and placement can be problematic. For example, prior art solutions do not address heterogeneous, multi-scale programmable logic arrays.

It is desired to quickly map a netlist of heterogeneous objects to an array of heterogeneous programmable logic resources. The heterogeneity on the object side refers to the fact that the netlist from the upstream tools (from the compilation flow and the technology mapping) comprises of a variety of different kinds of objects. There are traditional random logic gates that may come in to a placement tool. There are RTL constructs (e.g., adders, MUXes, larger components, etc.) and there is pipelining information that comes in. All of these are treated somewhat differently in a placement tool according to embodiments of the present invention.

Also, the array itself is heterogeneous. The array can be viewed as two different planes: a plane of function cells (FCs) and ALUs that map traditional logic, random logic and most of the arithmetic components, and then an array of TPUs (used, for example, to implement multipliers and register arrays to handle pipelining). Thus, there can be heterogeneity in both the input and the array. A problem addressed by the present system is how to take a netlist of heterogeneous objects (different kinds of objects) and map it into an array that is also heterogeneous.

In the prior art there was a lot of work related to placement for FPGAs. There are several differences between traditional FPGA placement and the current problem. One difference is that in the prior art the netlist (the input to an FPGA placement tool) is typically completely homogeneous as opposed to heterogeneous. The netlist is essentially random logic. More recently some have started including some higher level constructs in the netlist, the problem is still essentially a random logic placement problem. The input is homogeneous and the array itself is also viewed as a homogeneous array (of typically lookup tables).

Another aspect of traditional FPGA placement (and ASIC placement) is that traditional approaches to traditional problems spend a lot more time arriving at an optimal solution than with the current system. The present system includes software intended to drop into essentially a standard compilation flow so the end customer is able to compile a file and expect response in seconds or minutes; whereas with traditional FPGA placement and routing spending several hours is not uncommon.

Prior solutions did not address heterogeneity and the MSA. The present solution takes a constructive approach to doing the placement rather than a hill-climbing approach. The traditional techniques basically try to do a very broad search of the placement space typically with something like simulated annealing (which is very computationally intensive approach to trying many different placements and then gradually arriving at an optimal placement by exploring the space all around it).

The approach according to the present system and methodology is to try to construct from the bottom up a good placement and then do a little bit of manipulation of that placement to optimize it. This current approach is constructive. Rather than randomly searching the space and finding ones way down to an optimality, the present system attempts to arrive at an optimal placement from the bottom up by finding the pieces that naturally fit well together and aggregating those pieces and then doing so recursively until the system produces higher and higher constructs. Thus clustering technique is discussed herein. This technique addresses efficiency and to some extent addresses heterogeneity.

Further, the present system and methodology views the array as comprising multiple planes of different kinds of objects. As discussed herein, there is an FC plane (or ALU plane) and there is a TPU plane. To some extent there is also an I/O frame plane.

Figure 1:
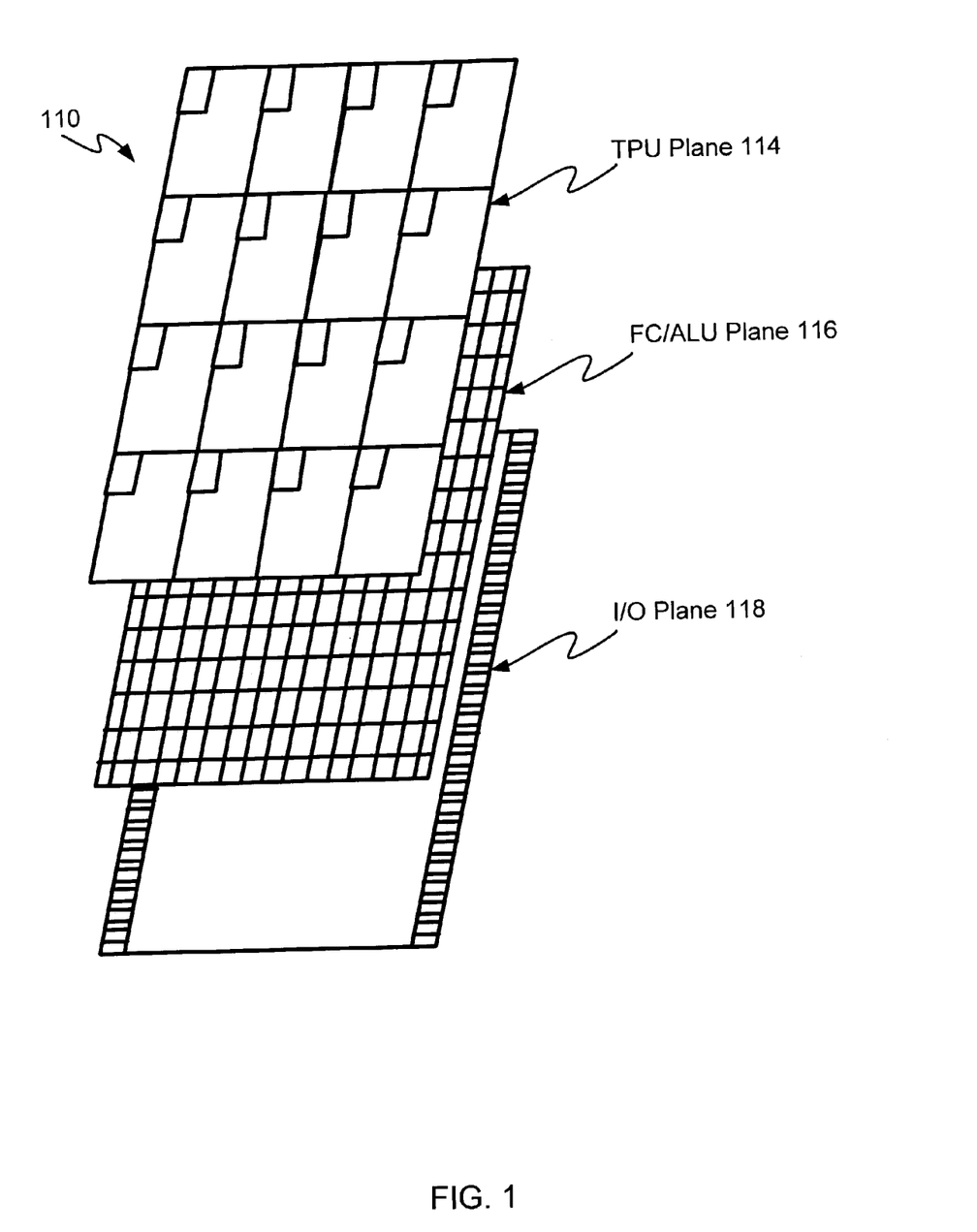
FIG. 1 is a schematic diagram of a multi-plane view of a programmable logic device, shown in disassembled relation, designed in accordance with an embodiment of the present invention.

Referring now to the drawings, FIG. 1 is a schematic drawing of an exemplary device in accordance with an embodiment of the present invention. The device is shown in FIG. 1 as Instruction Set Extension Fabric (ISEF) 110 (a programmable logic device such as from Stretch, Inc., of Los Gatos, Calif.) and described in the Programmable Logic Device Application, which has been incorporated by reference. However, it is contemplated that the device can be any suitable system. ISEF 110 is the programmable logic core of an MSA in one embodiment.

FIG. 1 is a multi-plane view of ISEF 110 shown in disassembled relation. ISEF 110 comprises transitive processing unit (TPU) plane 114, function cell/arithmetic logic unit (FC/ALU) plane 116 and input/output (I/O) plane 118. The concept illustrated is that in the design of a PLD. First I/O is placed, then random logic and arithmetic operations logic is placed, and finally transitive operations logic is placed. FIG. 1 is thus a high level view of the model a placement tool (described herein) has of the underlying fabric of a PLD designed according to one embodiment of the present invention. In one embodiment, because the present system is mapping to a particular instance of ISEF 110 in a chip, the I/O placement is fixed.

Figure 2:
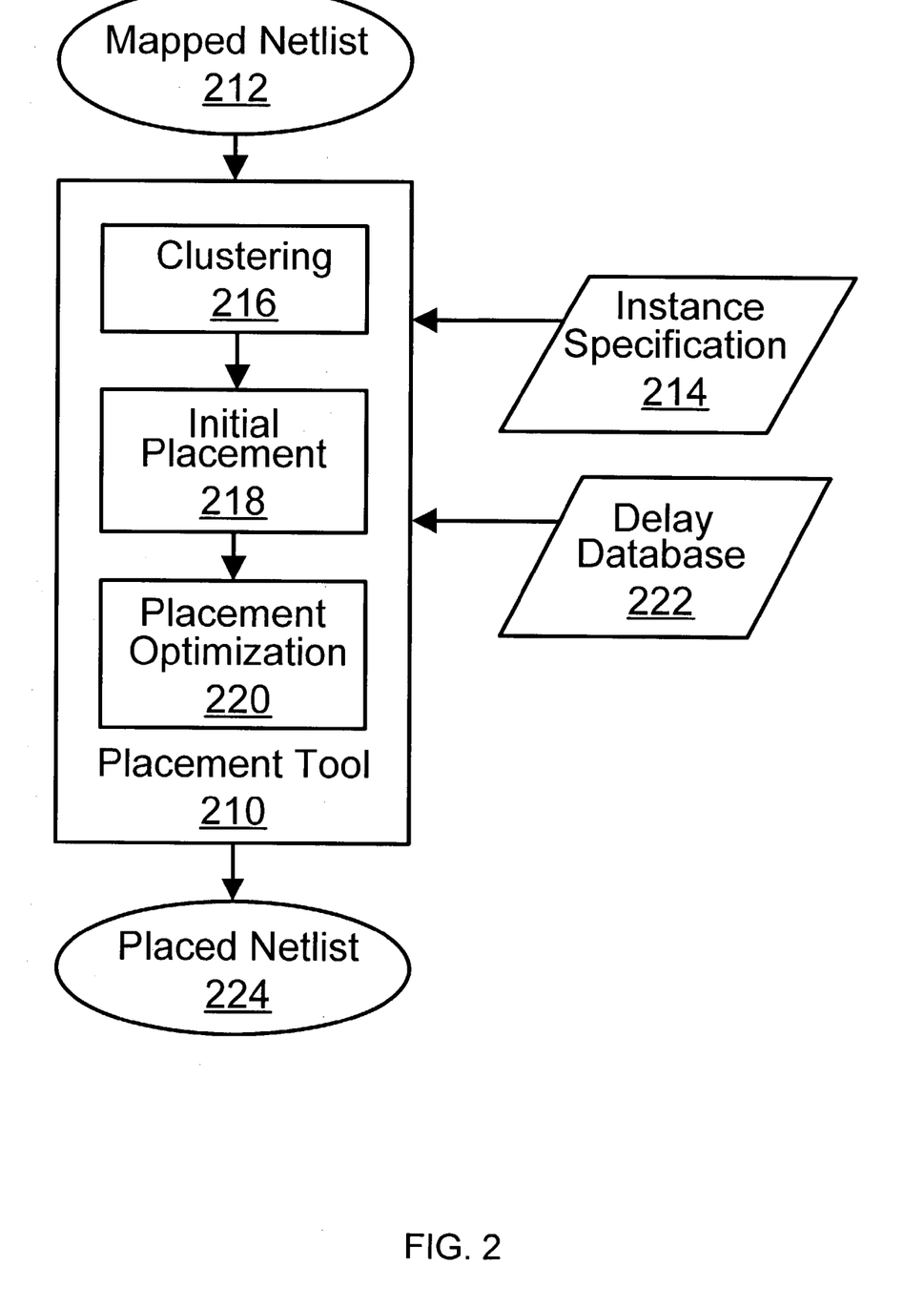
FIG. 2 is a schematic diagram illustrating the basic flow through a placement tool, in accordance with an embodiment of the present invention.

FIG. 2 illustrates the basic flow of using placement tool 210 in order to facilitate the design of ISEF 110. In use, mapped netlist 212 is a design-specific input to placement tool 210. Mapped netlist 212 comprises, for example, the following types of objects: individual function cells that implement random logic; individual function cells that implement pure flip flops; individual ALUs; clusters of ALUs and/or FCs that implement RTL operators such as adders (Clusters may contain relative placement information to express required spatial relationships between the members of the cluster.). Relative placements within a cluster are maintained by placement tool 210.); clusters of TPU blocks that implement multipliers and shifters. (In one embodiment, clusters of TPUs do not contain ALUs or FCs.). The objects in mapped netlist 212 are mapped to one of the three physical resource planes shown in FIG. 1.

Also shown is instance specification 214 that feeds into placement tool 210. Instance specification 214 comprises architecture-specific and instance-specific information. Instance specification 214 identifies a particular MSA architecture and I/O placement information.

Placement tool 210 comprises three main phases. There is a clustering phase 216. Clustering phase 216 attempts to identify underlying structure in random logic and data paths. There is initial placement phase 218. Initial placement phase 218 tries to find a reasonably good placement among the objects that the system clustered in clustering phase 216. There is also placement optimization phase 220. Optimization phase 220, given a set of initial placements, tries to make improvements to the placements. Further, delay database 222 inputs to placement tool 210. Delay database 222 provides delay information used by net cost functions. In one embodiment, this information is pre-compiled in the executable.

One of the tasks that placement tool 210 is responsible for is separating out TPU objects from FC/ALU objects. Mapped netlist 212 coming in to placement tool 210 may exhibit some degree of clustering already (e.g., modules such as adders, multipliers, etc. are represented as clusters in mapped netlist 212). Placement tool 210 separates out the objects that are to be part of TPU plane 114 from the rest of the design. Then, some objects may go from the rest of the design back into TPU plane 114 (discussed herein).

Once that is done, the way placement tool 210 specifies the relationships between what objects go in TPU plane 114 and what objects go in FC/ALU plane 116 is by establishing a set of constraints on the objects. An object itself may have some relative placement with respect to different pieces in the object's plane, but there can also be constraints that specify an object that gets placed into a first plane has to be placed with respect to something else in a second plane at some location or some range of locations. There can also be exclusion relationships (a type of constraint, e.g., an object cannot be placed in a certain location for some reason placement tool 210 is able to determine).

In general, any object can have any number of constraints, each of which may constrain the absolute placement of an object or relate the placement of an object to any other object, regardless of the plane. One use of constraints is to relate the placement of TPU modules to FC/ALU modules. However, constraints have other uses. These uses include blocking out certain regions of the array from certain types of objects, and relating objects of the same type that should be placed together.

In one embodiment, clustering techniques are used at one or more points in the flow to find and exploit structure inherent in the original design that may have been lost during the compilation flow. Effective clustering also reduces the number of objects to be placed, thereby reducing the search space and dramatically reducing the required run time.

The types of clustering performed by placement tool 210 include: datapath module construction in which vector oriented objects are recognized and assembled from small logic cells; pipeline chain construction in which two-dimensional arrays of flip-flops are recognized and packed into TPU clusters; datapath assembly in which closely related modules, either from mapped netlist 212 or constructed by earlier stages of placement tool 210, are grouped together to form higher level clusters; and quad block packing in which random logic cells (function cells that are not part of a recognized datapath) are packed into MSA quad blocks. In addition, placement tool 210 may also extend clusters (modules) present in an original mapped netlist 212 to include single FCs which, for performance reasons, are to be placed in close proximity. Further, the output of placement tool 210 comprises placed netlist 224.

Figure 3:
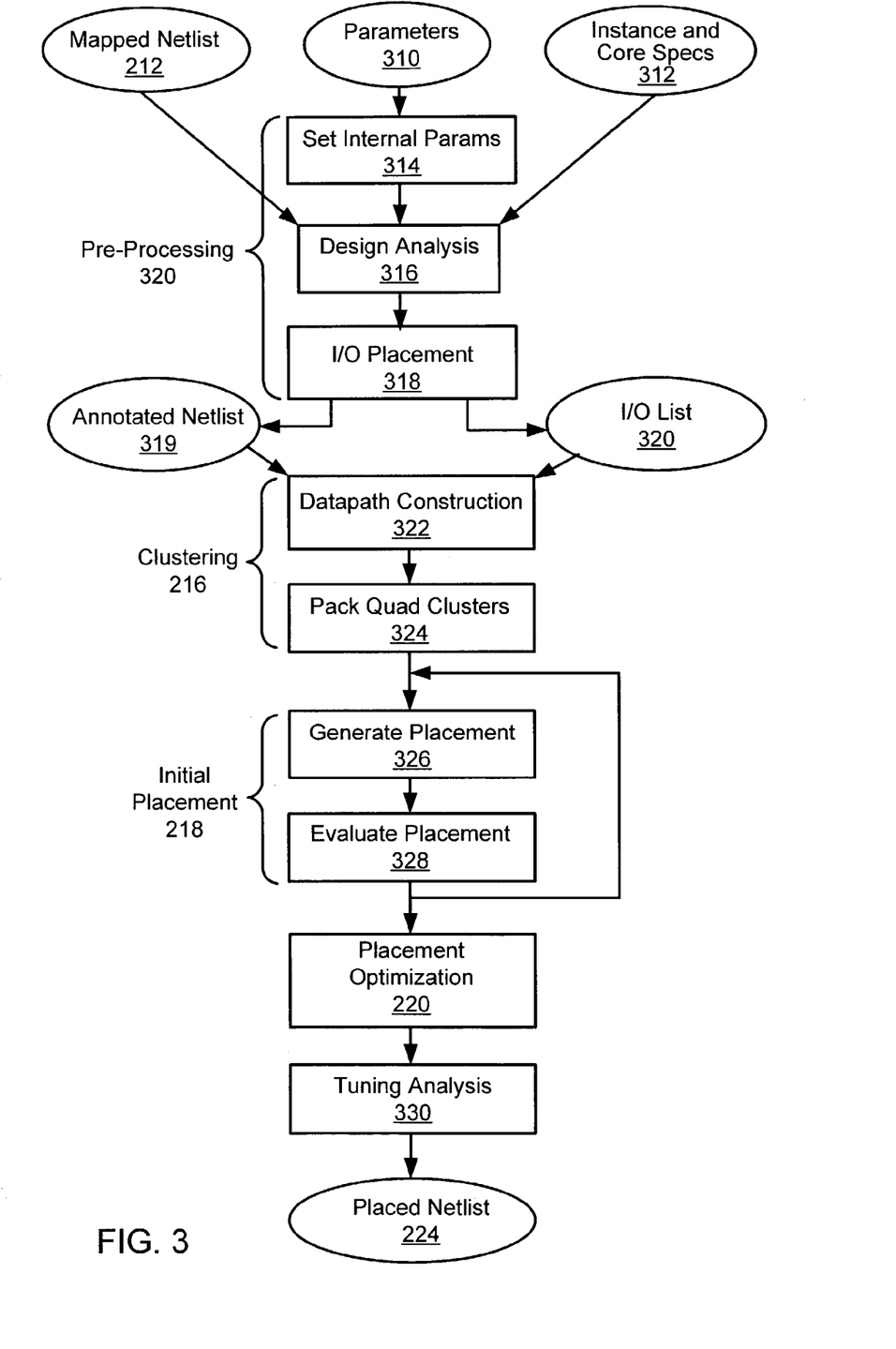
FIG. 3 is a schematic diagram illustrating FIG. 2 in greater detail, in accordance with an embodiment of the present invention.

FIG. 3 shows FIG. 2 in greater detail. Coming into the design flow as input is mapped netlist 212, parameters 310 and instance and core specs 312. Parameters 310 typically come into the flow in the form of command line options or are set in a graphical user interface (GUI). There may exist parameters 310 that control the trade-off between runtime and quality of result (e.g., an optimization level parameter). In a particular run of placement tool 210, a user has the ability choose the system to provide a very fast result and work less hard on optimality, or take as much time as needed to obtain the best result possible. The user can also choose the system to run within a range between the latter two extreme cases by setting the optimization level parameter. The optimization level parameter, in turn, is essentially decoded to set a number of other internal parameters (at Set Internal Parameters phase 314) that control a variety of aspects of the rest of the process.

Next, the system enters design analysis phase 316. In design analysis phase 316, the system looks at a number of different aspects of mapped netlist 212 and performs various transformations on mapped netlist 212. First, the system computes a number of statistics about mapped netlist 212. For example, the system counts the number of FCs, the number of modules, and performs some checks such as determining if the number of cells coming in exceeds the size of the array (in which case there may be no possible placement and the system would abort and send an error message to the user).

Once the system decides that there may be a feasible placement, then the system performs some additional transformations in mapped netlist 212. For example, the decomposition of clusters from FC/ALU plane and 116 TPU plane 114 occurs here. Therefore, if the system finds modules that came in that have both TPUs and ALUs in it then it separates those modules out into two different kinds of modules and establishes a set of constraints. There are some specific optimizations that are also performed in design analysis phase 316.

Instance and Core Specs 312 are input to placement tool 210 and give placement tool 210 information about the underlying array. Instance and Core Specs 312 contain information about the dimensions of the array, the particular MSA architecture, the mapping of the user net (port) names of the programmable logic to the physical location on the instance (a particular signal connected to a particular I/O pad or I/O site of the array has a mapping of the port name that the user refers to in his netlist to the physical location), etc.

One other part of design analysis phase 316 comprises computation of a criticality metric that is used later on in cost functions. The criticality metric is an estimate or an attempt to determine whether and to what extent every net in the design may be a participant in the critical path. For every net, the system determines the longest path that traverses that net and divides by the longest path in the design. That computation produces a value between zero and one. One is associated with a net that is in the longest path in the design, and a number close to zero is associated with a net that is not in a critical path.

In summary, within design analysis phase 316 computations that occur relate to statistic and estimation, mapped netlist 212 partitioning and looking for certain optimizations that can be performed within mapped netlist 212, and computation of a criticality metric.

After design analysis phase 316 the system enters I/O placement phase 318. One side effect of I/O placement phase 318 is that the system identifies vectors of the inputs and outputs. For clustering purposes, it is useful to know if a set of signals or a set of ports in the design are related, and if they are, what the ordering of that relationship is. That ordering is derived in I/O placement phase 318. Together, set internal parameters phase 314, design analysis phase 316 and I/O placement phase 318 can be grouped as pre-processing phase 320.

Figure 4:
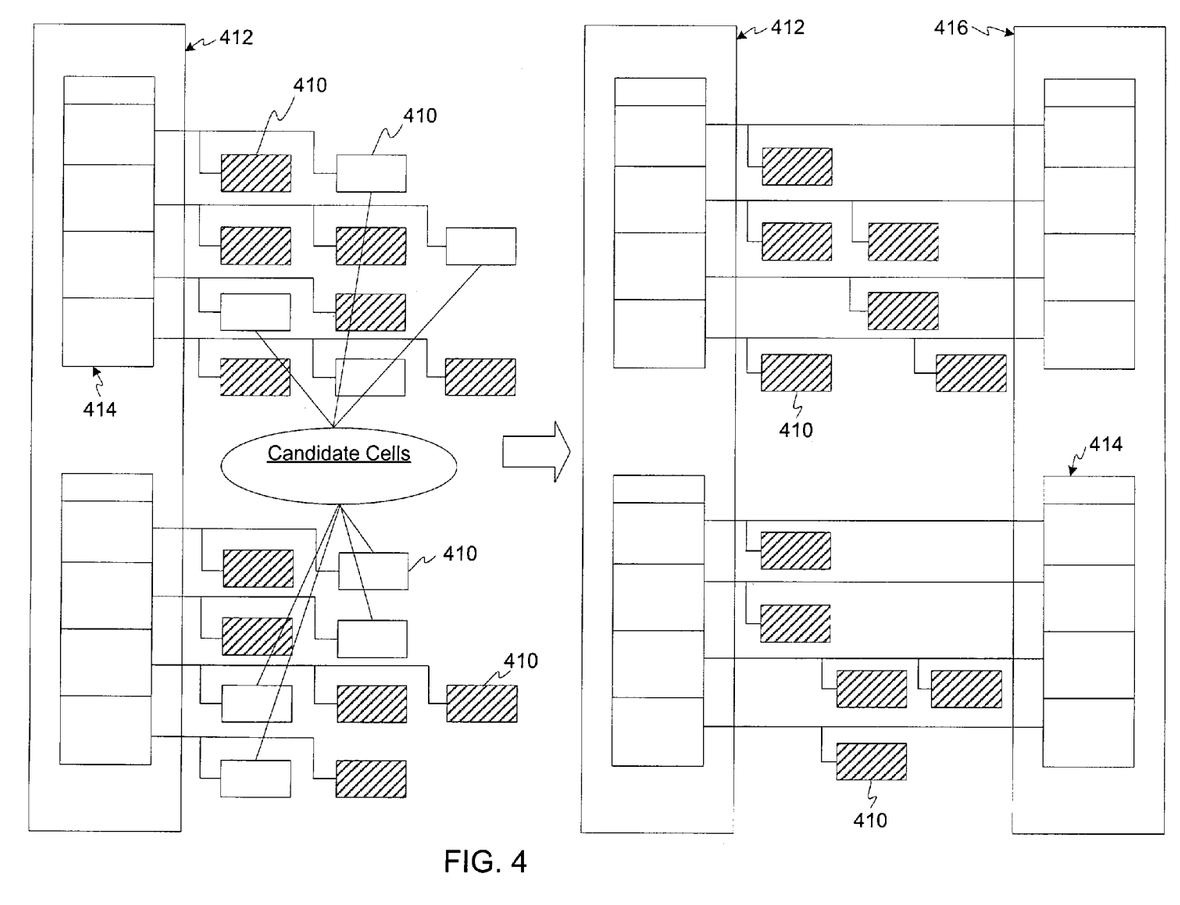
FIG. 4 is a schematic diagram illustrating clustering, in accordance with an embodiment of the present invention.

Next, the system enters clustering phase 216. Clustering phase 216 comprises datapath construction phase 322 and pack quad clusters phase 324. Referring to FIG. 4, the basic concept of clustering is to try to build up higher level constructs (objects) from mapped netlist 212. To some extent what the system is doing is re-identifying structure that was in the original design. In other words, the system derives or reconstitutes various aspects of various structures from the original design. The system identifies elements that belong together. Sometimes these elements were together in the original design. Other times there is a logical relationship between elements in mapped netlist 212 that was not obvious in the original design. Therefore, placement tool 210 derives relationships that may or may not have been obvious upstream. This derivation is accomplished in several phases.

The first phase is referred to as datapath construction phase 322. In datapath construction phase 322, annotated netlist 319 and I/O list 320 are inputs. Placement tool 210 identifies the potential pipeline registers (those registers that may be mapped into the TPUs). The system finds chains of registers (FCs that are only used as flip-flops) and temporarily takes them out from further consideration in the datapath. The system then examines the set of modules (e.g., ALU chains, etc.) received from a mapper and, for each module, examines the output side and input side.

The system finds patterns among FCs 410 hanging off of the output nets of seed module 412 comprising ALUs 414. The system starts with the least significant bit (LSB), in one embodiment, and derives a characteristic signature for each of the FCs hanging off of it. The characteristic signature involves analyzing the number of inputs, possible fan-out of the output, and the particular configuration of the FC 410 (what function the FC 410 is performing), among other things. For each of the FCs 410 on the LSB, the system then searches the nets of the other bits of that cluster looking for FCs 410 that have similar characteristics. If the system finds that there is an FC 410 hanging off every one of these (or even just a subset), the system takes all FCs 410 that match that characteristic and groups them into a new cluster. Now we have another set of ALUs 414 that have been made out of these FCs 410 that were hanging off of the output. The system turns these ALUs into a cluster we will refer to as constructed module 416. The system no longer has to treat these FCs 410 as individual FCs 410.

The system can perform similar operations on both inputs and outputs. The system keeps clustering until it does not find objects that are closely related. That is one phase of the clustering.

Now the system, if it can find a set of register chains that can be ordered (have some relationship among the input nets), takes those chains and creates TPU blocks out of them. However, if the TPU plane is exhausted then the register chains that are longest are put into the TPU plane.

Still in datapath construction phase 322, the system now has a plurality of clusters that typically represent single column-wide ALU constructs (they may be arithmetic or logical or just register banks that did not get mapped into TPUs).

Now datapath merging is performed. The system finds relationships among the objects/clusters that it has (either ones that came in from a mapper or ones that were generated). This operation is basically a higher level clustering of clusters.

In order to facilitate this higher level clustering of clusters the system computes what is called an affinity metric. For pairs of clusters the system determines if there a relationship between the two clusters such that if the system combines them it reduces the number of nets that need to get routed outside of them. The system thus computes affinity metrics between pairs of modules.

An affinity metric, in one embodiment, is defined as one minus the number of external nets in a merged module divided by the number of external nets in each of the two modules individually. In other words, if the system combines two modules, some of the nets that would have been routed between them now are entirely internal to the combination and they do not need to get routed. The closer the affinity metric is to one, the tighter the relationship is between the modules. The affinity metric would be one if every single net that was external to the two modules disappeared (became an internal net). If the affinity metric were zero, that would mean were no common nets—nothing ended up getting completely subsumed. In this case the two modules would be unrelated. The system calculates the affinity metrics and then orders (sorts) the pairs according to the affinity metrics, and for some threshold combines the modules in pairs.

There are some additional factors in a cost function that determine whether the system combines modules. For example, in addition to examining the affinity metric the system might also examine routability. The system can calculate routability metrics that relate to how far internal nets are routed. Once the system makes those calculations, the system combines the sorted list of module pairs to make new modules. The system performs these operations recursively until the system does not find any more modules that the system can safely merge. At this point the system has produced a relatively small number of larger clusters. However, there are potentially FCs left over that did not get pulled into the clusters (modules) (e.g., random logic—typically control logic).

The system then enters another clustering phase to try to find relationships among the random logic. That phase is a quad packing phase referred to as pack quad clusters phase 324. In this phase, after the datapaths have been identified, the remaining unassigned FCs 410 are clustered into quad blocks. A quad block comprises, in one embodiment, four ALUs that each comprise four FCs 410. The system considers placement and routing constraints within each quad block while choosing seed FCs to pack, and produces a placement of the FCs 410 at the end of the phase. This placement is then subject to one or more iterative improvement passes.

Eventually, every FC 410 is part of a cluster. The clusters become placeable objects to be placed within a plane. The system next enters initial placement phase 218, which comprises generate placement phase 326 and evaluate placement phase 328. The purpose of initial placement phase 218 is to find spatial relationships that are routable in the planes. A greedy algorithm is applied in generate placement phase 326. Given a particular starting cluster, the best possible placement is found. Once that cluster is placed, the next most closely coupled cluster (the cluster with the most connections to what was placed) is found and placed. This process is then iterated until all of the clusters are placed in the planes. A given placement is, after it is made, evaluated in evaluate placement phase 328.

A cost function is used in evaluating placement phase 328. For every path from a source to a sink on a net the system computes an estimate of the delay. Multiple sink pins on a single placeable cluster are abstracted to a single pin whose location is, in one embodiment, the median of the actual locations of the pins. It is contemplated that the delays can be modeled in various ways, depending upon whether the source and sink pins are within the same quad blocks, etc.

The route delay is then scaled by a function of the criticality.

In placement optimization phase 220, the system seeks to improve the quality of the results of the initial placement. Historically, placement optimization is done with a stochastic hill climbing technique such as simulated annealing. These types of techniques work best when the objects being placed are relatively homogeneous and interchangeable.

In the present system, the objects the system is working with are heterogeneous in size, shape, clock distribution and type (e.g., ALU vs. TPU) in one embodiment. Also, the quality of the placement produced by the cluster-based initial placer operating on instruction extensions is quite good. Therefore, the present system uses an iterative improvement strategy that is much faster than a conventional simulated annealer. The iterative improvement strategy employed is based on a graph partitioning algorithm proposed by Fiduccia and Mattheyses (FM). The FM algorithm evaluates possible pair-wise exchanges, evaluates the result and accepts the one exchange that lowers the overall cost the most. This process is repeated until no exchange produces a lower cost. In one embodiment, this process typically converges in approximately 25 iterations.

Subsequently, the system enters a tuning analysis phase 330. Tuning analysis phase 330 computes a large number of statistics that are used to tune various parameters within the system. Placed (annotated) netlist 224 is then produced, comprising placement information and clustering information.

The present system and methodology improve over traditional approaches to placement for FPGAs. Traditional placement included taking a set of homogeneous physically identical (although configured differently) cells and quickly finding some simple initial placement, subsequently spending a great deal of time simulating and annealing to try to optimize that placement. That method does not work when the array and netlist coming in are heterogeneous. The present system provides a methodology to account for those problems. The methodology of the present system is constructive in that it seeks to build up from the lowest level elements coming from the netlist from the user's design. The present system builds up these larger constructs that are naturally related and tightly coupled. The present system minimizes the number of things that need to be placed.

Figure 5:
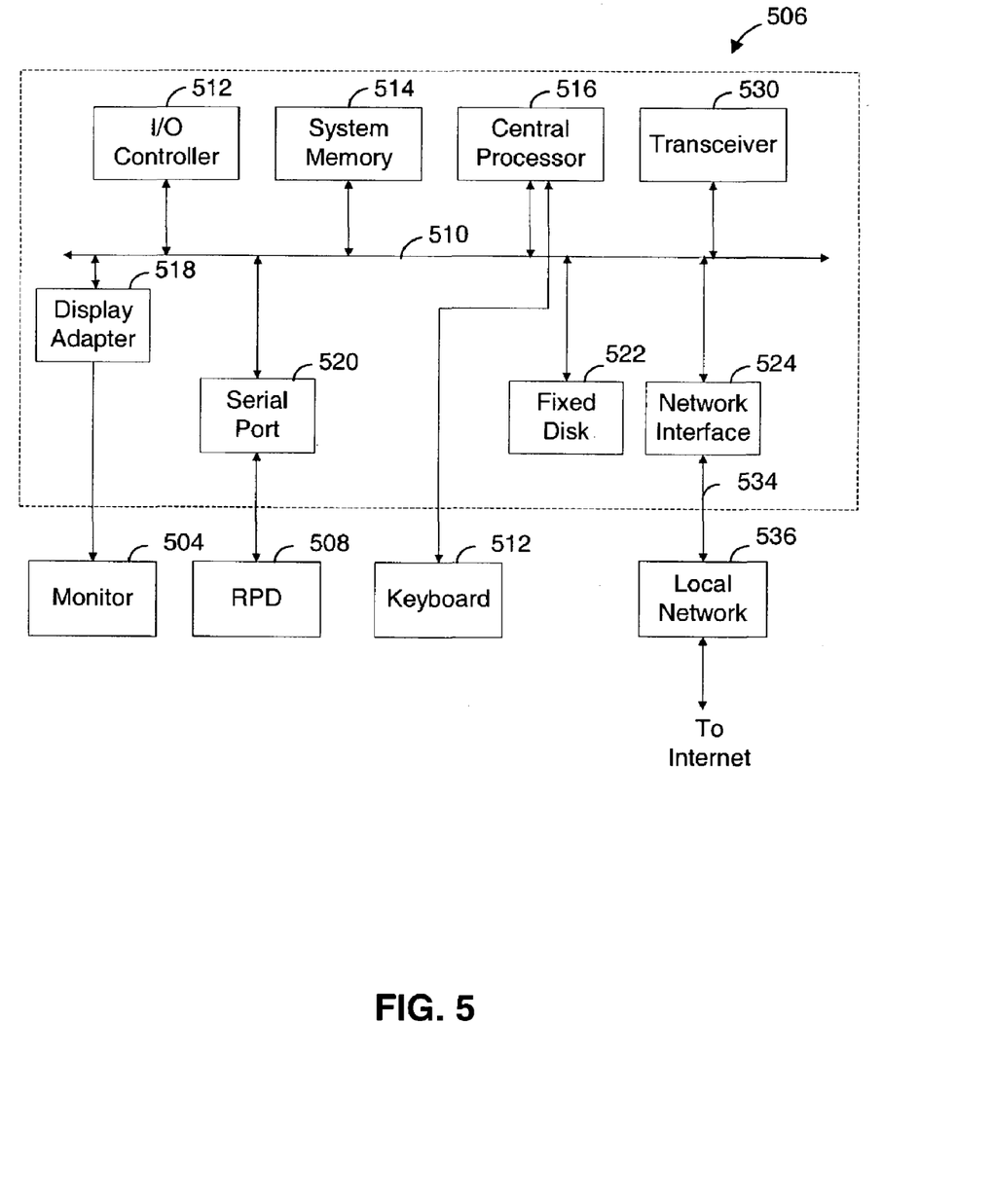
FIG. 5 illustrates subsystems of an exemplary computer system for use with the present system.

FIG. 5 illustrates subsystems found in one exemplary computer system, such as computer system 506, that can be used in accordance with embodiments of the present invention. Computers can be configured with many different hardware components and can be made in many dimensions and styles (e.g., laptop, palmtop, server, workstation and mainframe). Thus, any hardware platform suitable for performing the processing described herein is suitable for use with the present invention.

Subsystems within computer system 506 are directly interfaced to an internal bus 510. The subsystems include an input/output (I/O) controller 512, a system random access memory (RAM) 514, a central processing unit (CPU) 516, a display adapter 518, a serial port 520, a fixed disk 522 and a network interface adapter 524. The. use of bus 510 allows each of the subsystems to transfer data among the subsystems and, most importantly, with CPU 516. External devices can communicate with CPU 516 or other subsystems via bus 510 by interfacing with a subsystem on bus 510.

FIG. 5 is merely illustrative of one suitable configuration for providing a system in accordance with the present invention. Subsystems, components or devices other than those shown in FIG. 5 can be added without deviating from the scope of the invention. A suitable computer system can also be achieved without using all of the subsystems shown in FIG. 5. Other subsystems such as a CD-ROM drive, graphics accelerator, etc., can be included in the configuration without affecting the performance of computer system 506.

One embodiment according to the present invention is related to the use of an apparatus, such as computer system 506, for implementing a system according to embodiments of the present invention. CPU 516 can execute one or more sequences of one or more instructions contained in system RAM 514. Such instructions may be read into system RAM 514 from a computer-readable medium, such as fixed disk 522. Execution of the sequences of instructions contained in system RAM 514 causes the CPU 516 to perform process steps, such as the process steps described herein. One or more processors in a multi-processing arrangement may also be employed to execute the sequences of instructions contained in the memory. In alternative embodiments, hard-wired circuitry may be used in place of or in combination with software instructions to implement the invention. Thus, embodiments of the invention are not limited to any specific combination of hardware circuitry and software.

The terms "computer-readable medium" and "computer-readable media" as used herein refer to any medium or media that participate in providing instructions to CPU 516 for execution. Such media can take many forms, including, but not limited to, non-volatile media, volatile media and transmission media. Non-volatile media include, for example, optical or magnetic disks, such as fixed disk 522. Volatile media include dynamic memory, such as system RAM 514. Transmission media include coaxial cables, copper wire and fiber optics, among others, including the wires that comprise one embodiment of bus 510. Transmission media can also take the form of acoustic or light waves, such as those generated during radio frequency (RF) and infrared (IR) data communications. Common forms of computer-readable media include, for example, a floppy disk, a flexible disk, a hard disk, magnetic tape, any other magnetic medium, a CD-ROM disk, digital video disk (DVD), any other optical medium, punch cards, paper tape, any other physical medium with patterns of marks or holes, a RAM, a PROM, an EPROM, a FLASHEPROM, any other memory chip or cartridge, a carrier wave, or any other medium from which a computer can read.

Various forms of computer-readable media may be involved in carrying one or more sequences of one or more instructions to CPU 516 for execution. Bus 510 carries the data to system RAM 514, from which CPU 516 retrieves and executes the instructions. The instructions received by system RAM 514 can optionally be stored on fixed disk 522 either before or after execution by CPU 516.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of mapping heterogeneous objects onto an array of heterogeneous programmable logic resources, the method comprising:

clustering the heterogeneous objects from a mapped netlist to identify datapath modules;

aggregating the datapath modules into higher level modules of the heterogeneous objects and clusters of the heterogeneous objects;
clustering random logic into structures for the array of heterogeneous programmable logic resources; and
determining placement of the higher level modules and the structures in the array of heterogeneous programmable logic resources.

2. The method of claim 1, wherein the array is a multi-scale programmable array.

3. The method of claim 2, wherein clustering creates transitive processing unit (TPU) clusters.

4. The method of claim 2, wherein clustering creates function cell/arithmetic logic unit (FC/ALU) clusters.

5. The method of claim 2, wherein the array comprises a transitive processing unit (TPU) plane and a function cell/arithmetic logic unit (FC/ALU) plane.

6. The method of claim 1, wherein the method comprises a pre-processing phase, a clustering phase, an initial placement phase and an optimization phase.

7. The method of claim 1, wherein constraints affect the placement of objects.

8. A system for mapping heterogeneous objects onto an array of heterogeneous programmable logic resources, the system comprising:
a first clustering module for clustering the heterogeneous objects from a mapped netlist to identify datapath modules;
an aggregating module for aggregating the datapath modules into higher level modules of the heterogeneous objects and clusters of the heterogeneous objects;
a second clustering module for clustering random logic into structures for the array of heterogeneous programmable logic resources; and
a placement module for determining placement of the higher level modules and the structures in the array of heterogeneous programmable logic resources.

9. The system of claim 8, wherein the array is a multi-scale programmable array.

10. The system of claim 9, wherein clustering creates transitive processing unit (TPU) clusters.

11. The system of claim 9, wherein clustering creates function cell/arithmetic logic unit (FC/ALU) clusters.

12. The system of claim 9, wherein the array comprises a transitive processing unit (TPU) plane and a function cell/arithmetic logic unit (FC/ALU) plane.

13. The system of claim 8, wherein the system comprises a pre-processing phase, a clustering phase, an initial placement phase and an optimization phase.

14. The system of claim 8, wherein constraints affect the placement of objects.

15. An electronically-readable medium having embodied thereon a program, the program being executable by a machine to perform a method of mapping heterogeneous objects onto an array of heterogeneous programmable logic resources, the method comprising:
clustering the heterogeneous objects from a mapped netlist to identify datapath modules;
aggregating the datapath modules into higher level modules of the heterogeneous objects and clusters of the heterogeneous objects;
clustering random logic into structures for the array of heterogeneous programmable logic resources; and
determining placement of the higher level modules and the structures in the array of heterogeneous programmable logic resources.

16. The electronically-readable medium of claim 15, wherein the array is a multi-scale programmable array.

17. The electronically-readable medium of claim 16, wherein clustering creates transitive processing unit (TPU) clusters.

18. The electronically-readable medium of claim 16, wherein clustering creates function cell/arithmetic logic unit (FC/ALU) clusters.

19. The electronically-readable medium of claim 16, wherein the array comprises a transitive processing unit (TPU) plane and a function cell/arithmetic logic unit (FC/ALU) plane.

20. The electronically-readable medium of claim 15, wherein the method comprises a pre-processing phase, a clustering phase, an initial placement phase and an optimization phase.

21. The electronically-readable medium of claim 15, wherein constraints affect the placement of objects.

22. A system for mapping heterogeneous objects onto an array of heterogeneous programmable logic resources, the system comprising:
first clustering means for clustering the heterogeneous objects from a mapped netlist to identify datapath modules;
aggregating means for aggregating the datapath modules into higher level modules of the heterogeneous objects and clusters of the heterogeneous objects; and
second clustering means for clustering random logic into structures for the array of heterogeneous programmable logic resources; and
placement means for determining placement of the higher level modules and the structures in the array of heterogeneous programmable logic resources.

23. The system of claim 22, wherein the array is a multi-scale programmable array.

24. The system of claim 23, wherein clustering creates transitive processing unit (TPU) clusters.

25. The system of claim 23, wherein clustering creates function cell/arithmetic logic unit (FC/ALU) clusters.

26. The system of claim 23, wherein the array comprises a transitive processing unit (TPU) plane and a function cell/arithmetic logic unit (FC/ALU) plane.

27. The system of claim 22, wherein the system comprises a pre-processing phase, a clustering phase, an initial placement phase and an optimization phase.

28. The system of claim 22, wherein constraints affect the placement of objects.

* * * * *

UNITED STATES PATENT AND TRADEMARK OFFICE
CERTIFICATE OF CORRECTION

| | | |
|---|---|---|
| PATENT NO. | : 7,000,211 B1 | Page 1 of 1 |
| APPLICATION NO. | : 10/404680 | |
| DATED | : February 14, 2006 | |
| INVENTOR(S) | : Jeffrey M. Arnold | |

It is certified that error appears in the above-identified patent and that said Letters Patent is hereby corrected as shown below:

\* On the face of the patent at ( \* ):

"This patent issued on a continued prosecution application filed under 37 CFR 1.53(d), and is subject to the twenty year patent term provisions of 35 U.S.C. 154(a)(2)" should be deleted.

Signed and Sealed this

Sixth Day of November, 2007

JON W. DUDAS
*Director of the United States Patent and Trademark Office*